United States Patent [19]
Berube et al.

[11] Patent Number: 6,038,637
[45] Date of Patent: Mar. 14, 2000

[54] UNIVERSAL DRAM ADDRESS MULTIPLEXER

[75] Inventors: Jean Luc Joseph Berube, Hull; Stewart John Parfitt, Nepean; Dean James Young, Kanata; Doug N. Knight, Nepean, all of Canada

[73] Assignee: Nortel Networks Corporation, Montreal, Canada

[21] Appl. No.: 08/978,476

[22] Filed: Nov. 25, 1997

[51] Int. Cl.[7] ............................................. G06F 12/00

[52] U.S. Cl. ................... 711/105; 711/100; 365/189.05; 365/230.02; 365/230.06

[58] Field of Search ............................... 711/1, 100, 105, 711/202; 365/189.05, 230.02, 230.06

[56] References Cited

U.S. PATENT DOCUMENTS

| | | | |
|---|---|---|---|
| 5,600,604 | 2/1997 | Chen | 365/230.06 |
| 5,802,603 | 9/1998 | Bains et al. | 711/202 |
| 5,805,854 | 9/1998 | Shigeeda | 365/201 |

*Primary Examiner*—Tuan V. Thai

[57] ABSTRACT

This invention relates to a method and circuit for addressing a symmetric or asymmetric $2^M$-element DRAM module using identical circuitry. The method consists of receiving an original address comprising M bits 0 to M−1 identifying a specific memory element, then deriving from these bits a column address and a row address which together identify the specific memory element. The column address comprises N bits 0 to N−1 which match in direct order bits 0 to N−1 of the original address and the row address comprises N bits 0 to N−1 which match in reverse order bits N−2 to M−1 of the original address. A circuit for selectively connecting a set of input address lines to a set of output address lines in a column mapping or a row mapping is also disclosed. The circuit comprises M input address lines 0 to M−1 and N output address lines 0 to N−1. The column mapping associates output address lines 0 to N−1 with input address lines 0 to N−1 in direct order, and the row mapping associates output address lines 0 to N−1 with input address lines N−2 to M−1 in reverse order. The circuit may also comprise a strobe signal for selecting between the column mapping and the row mapping.

6 Claims, 9 Drawing Sheets

6,038,637

UNIVERSAL DRAM ADDRESS MULTIPLEXER

FIELD OF THE INVENTION

This invention generally relates to memory modules in a computer system, and specifically to addressing schemes for accessing elements of such memory modules.

BACKGROUND OF THE INVENTION

An important component of any computer system is the memory where data is stored. A commonly used memory module is a so-called dynamic random access memory, or DRAM module. The internal organization of a DRAM module can be viewed as a matrix of memory elements, arranged in rows and columns. Currently, the most frequently used DRAM modules are either of a symmetric type, with an equal number of rows and columns, or of an asymmetric type, in which the ratio of the number of rows to the number of columns is a power of four.

A particular memory element of an ordinary memory module is usually accessed by selecting an address containing a certain number of bits and either reading from or writing to that original address in memory. For a symmetric DRAM module of a given size, however, only half of the original address bits are available for accessing the memory. An address multiplexer is used to access the desired memory element by multiplexing (splitting) the original address into a row address and a column address, each with exactly half the bits of the original address. Conceptually, this can be viewed as mapping a certain set of bits to two smaller subsets of bits. A row address strobe and a column address strobe, synchronized with the output of the address multiplexer, indicate to the DRAM module whether the bits being presented to it at a given time identify the desired row or column. Once both a row and a column have been presented to the DRAM module, a value is either extracted from or written to the chosen memory location, and the operation is complete.

If an asymmetric DRAM module of the same size is employed, then the matrix of memory elements has four, sixteen, or any other power of four, times as many rows as columns. In other words, addressing a particular memory element in the matrix requires two ($=\log_2 4$), four ($=\log_2 16$), or more generally an even number more bits to represent the row than to represent the column. However, the multiplexing circuitry used for symmetric DRAM modules, being configured for an identical number of rows and columns, is not capable of accessing each memory element of an asymmetric DRAM module, and vice versa. Therefore, a circuit card containing DRAM modules has a memory controller and associated wiring which will differ according to the type of DRAM used.

In the telecommunications industry, products, including circuit cards employing DRAM modules, are designed for a long life. Some applications require symmetric DRAM modules, and others require asymmetric DRAM modules. Still other circuit cards use either type of DRAM module depending on variables such as availability, manufacturer and cost. Therefore, different applications could use the same circuit card if only it were not for the two distinct wiring configurations demanded by the two types of DRAM.

It would thus be desirable to simply change between DRAM modules, instead of having to manufacture and support two different types of circuit cards. That is to say, there is a need to design the circuit card so that it can be used, without changing the wiring, with both symmetric and asymmetric DRAM modules.

U.S. Pat. No. 5,600,604 to Chen discloses a scheme whereby a column address decode module is added to the usual memory controller circuitry of a circuit card employing a symmetric single in-line memory module (SIMM). This allows an asymmetric SIMM to replace a symmetric SIMM without requiring a change to the wiring of the circuit card. However, the additional decoder is sensitive to the timing of the circuit, and its complexity increases with the number of memory modules to be accessed. Furthermore, the design is specifically geared towards single in-line memory modules, and not towards DRAM modules in general.

SUMMARY OF THE INVENTION

It is an object of the present invention to permit the facile interchange of symmetric and asymmetric DRAM modules, thereby mitigating or obviating one or more disadvantages of the prior art.

The invention may be summarized according to a first broad aspect as a method of addressing a DRAM module having a matrix of $2^M$ memory elements arranged in rows and columns, consisting of receiving an original address comprising a plurality of bits 0 to M−1 identifying a specific memory element, and deriving from the plurality of bits a column address and a row address which together identify the specific memory element, wherein the column address comprises a plurality of bits 0 to N−1 which match in direct order bits 0 to N−1 of the original address and the row address comprises a plurality of bits 0 to N−1 which match in reverse order bits N−2 to M−1 of the original address.

The invention may be summarized according to a second broad aspect as a circuit for selectively connecting a set of input address lines to a set of output address lines in a column mapping or a row mapping, comprising a plurality of input address lines 0 to M−1 and a plurality of output address lines 0 to N−1, wherein the column mapping associates output address lines 0 to N−1 with input address lines 0 to N−1 in direct order, and the row mapping associates output address lines 0 to N−1 with input address lines N−2 to M−1 in reverse order.

BRIEF DESCRIPTION OF THE DRAWINGS

A preferred embodiment of the invention will now be described with reference to the attached drawings in which.

DETAILED DESCRIPTION OF THE PREFERRED EMBODIMENT

Figure 1:
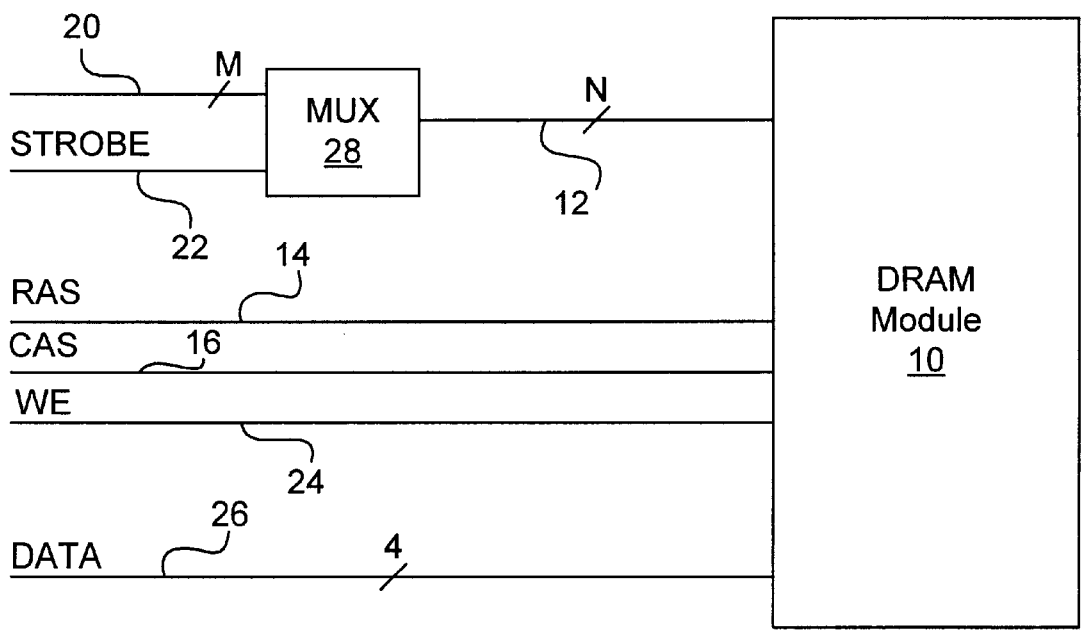
FIG. 1 is a block diagram of a memory addressing scheme consisting of an address multiplexer circuit and a DRAM module, as used in the prior art and in accordance with one embodiment of the present invention.

Referring to FIG. 1, a piece of hardware known as an address multiplexer 28 performs a controlled selection or mapping of a finite number (say N) of output DRAM address lines 12 from a finite number (say M) of input original address lines 20. The selection is controlled by the strobe signal 22 received from a central processing unit (CPU, not shown), which toggles the mapping between two predetermined combinatorial possibilities. That is to say, the N DRAM address lines 12 represent either an N-bit row address or an N-bit column address, depending on the value of the strobe signal 22. The CPU controls the value of the strobe signal and synchronizes it with a row address strobe (RAS) 14 and a column address strobe (CAS) 16 presented to the DRAM module.

The DRAM module 10 accepts the N DRAM address lines 12 along with the RAS 14 and CAS 16 signals. It receives an additional write enable (WE) signal 24 which will indicate whether a write or a read operation has been requested. There is a finite number (say 4) of data lines 26 which carry the data from an external element (not shown) to the DRAM module 10 if the desired operation is a write, and from the DRAM module 10 to the external element if the desired operation is a read. Both the DRAM module 10 and the address multiplexer 28 may possess additional inputs or features as known in the art, without functionally impairing, or being functionally impaired by, the present invention.

It is important to distinguish between an M-bit original address, which is presented to the address multiplexer 28 on M original address lines 20, and an N-bit DRAM address, which is presented to a DRAM module 10 on N DRAM address lines 12, and which may be either an N-bit row address or an N-bit column address, depending on the value of the strobe signal.

Figure 2A:
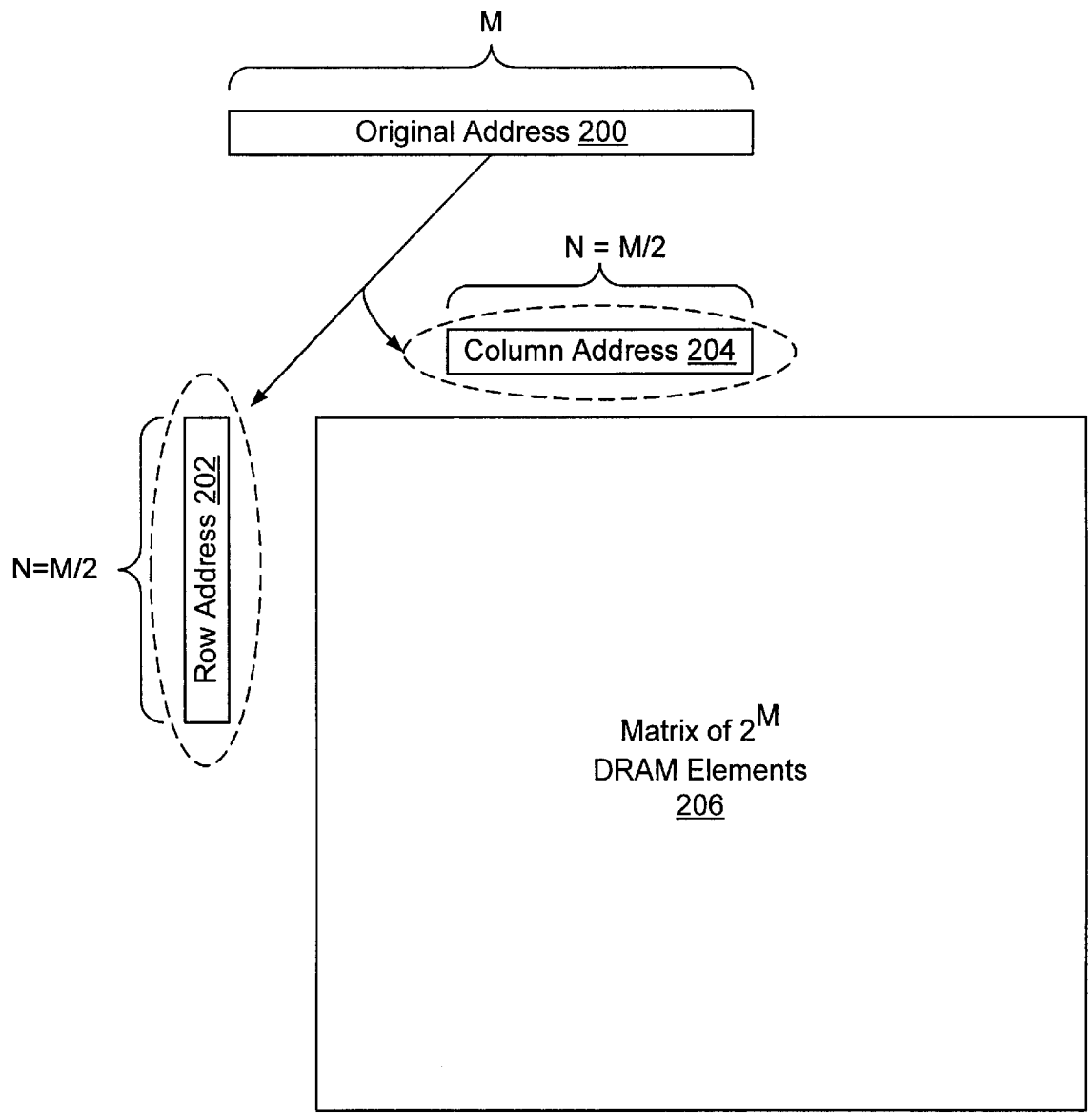
FIGS. 2A and 2B are conceptual illustrations of how, in the prior art, an original address is mapped into a row address and a column address by the address multiplexer of FIG. 1A.
Figure 2B:
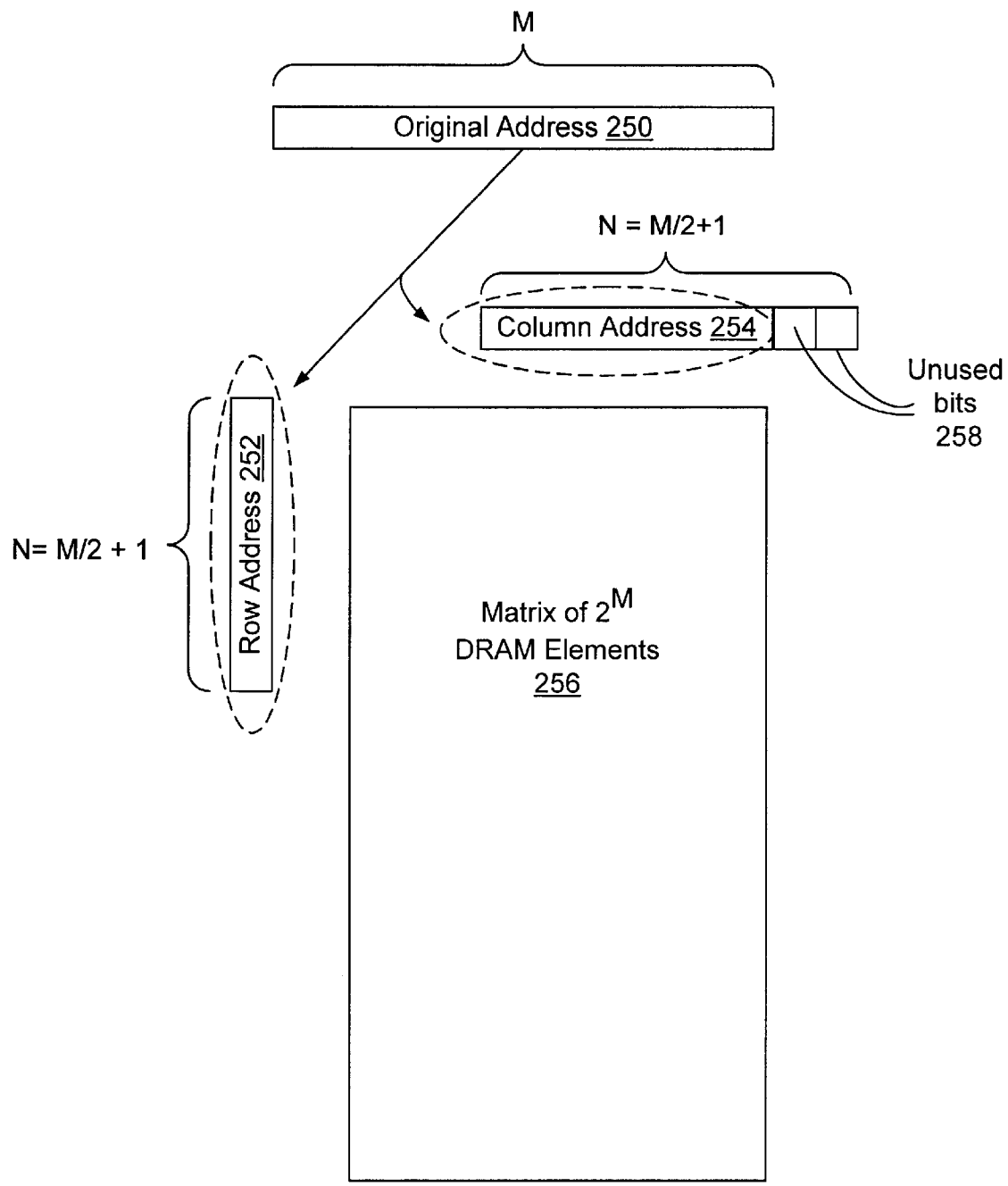

In the prior art, a simple relationship between N and M exists which depends on whether the DRAM module 10 is symmetric or asymmetric. FIGS. 2A and 2B provide assistance in explaining this relationship, and portray the DRAM module as a matrix of $2^M$ memory elements 206 (symmetric), 256 (asymmetric) For a symmetric DRAM module, as seen in FIG. 2A, exactly half of the M original address bits 200 are used to form a full set of row address bits 202 and the other half form a full set of column address bits 204; therefore, N is simply M/2.

If the DRAM module is asymmetric with four times as many rows as columns, as in FIG. 2B, then one-half plus one of the M original address bits 250 are used to construct a full set of row address bits 252, and the remaining M/2−1 original address bits are used to define an incomplete set of column address bits 254. Two additional unused bits 258, whose values are irrelevant, complete the full set of column address bits 254 for a total of N =M/2+1 bits. The function of the unused bits is to make the total number of row address bits and column address bits identical. A key observation is that in the prior art, the number of DRAM address bits differs between symmetric (equal number of rows and columns) and asymmetric (four times more rows than columns) DRAM memory modules, where it is M/2 and M/2+1, respectively. Clearly, an asymmetric DRAM module with a higher row:column ratio will require still more DRAM address bits.

Figure 3A:
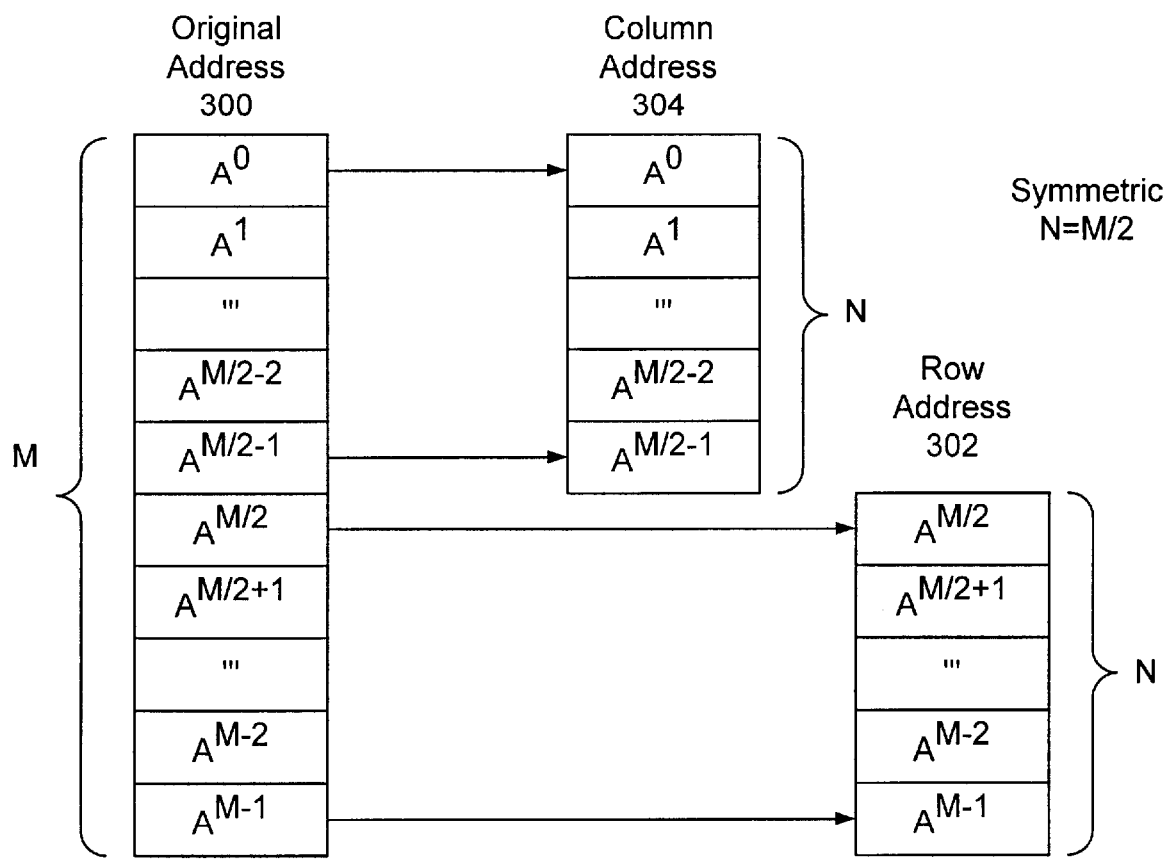
FIGS. 3A and 3B are detailed diagrams illustrating the prior art mappings of FIGS. 2A and 2B, respectively.

An overview of how the prior art address multiplexer 28 of FIG. 1 selectively outputs one of two predetermined sets of N DRAM address lines 12 from M input original address lines has been offered. In order to explain the benefits of the present invention, however, it is necessary to describe in more detail the mapping performed by the address multiplexer of the prior art. To this end, FIG. 3A shows, for a symmetric DRAM module, M original address bits 300, along with N row address bits 302 and N column address bits 304.

When the strobe signal (22 in FIG. 1) is set such that a column address is to be fed to the DRAM module (10 in FIG. 1), the N column address bits 304 will consist of the first N of M original address bits 300. If a row address is to be generated, then the last N of M original address bits 300 form the row address bits 302. Any ordering present in either half of the M original address bits 300 is preserved in the corresponding column address bits 304 or row address bits 302.

Figure 3B:
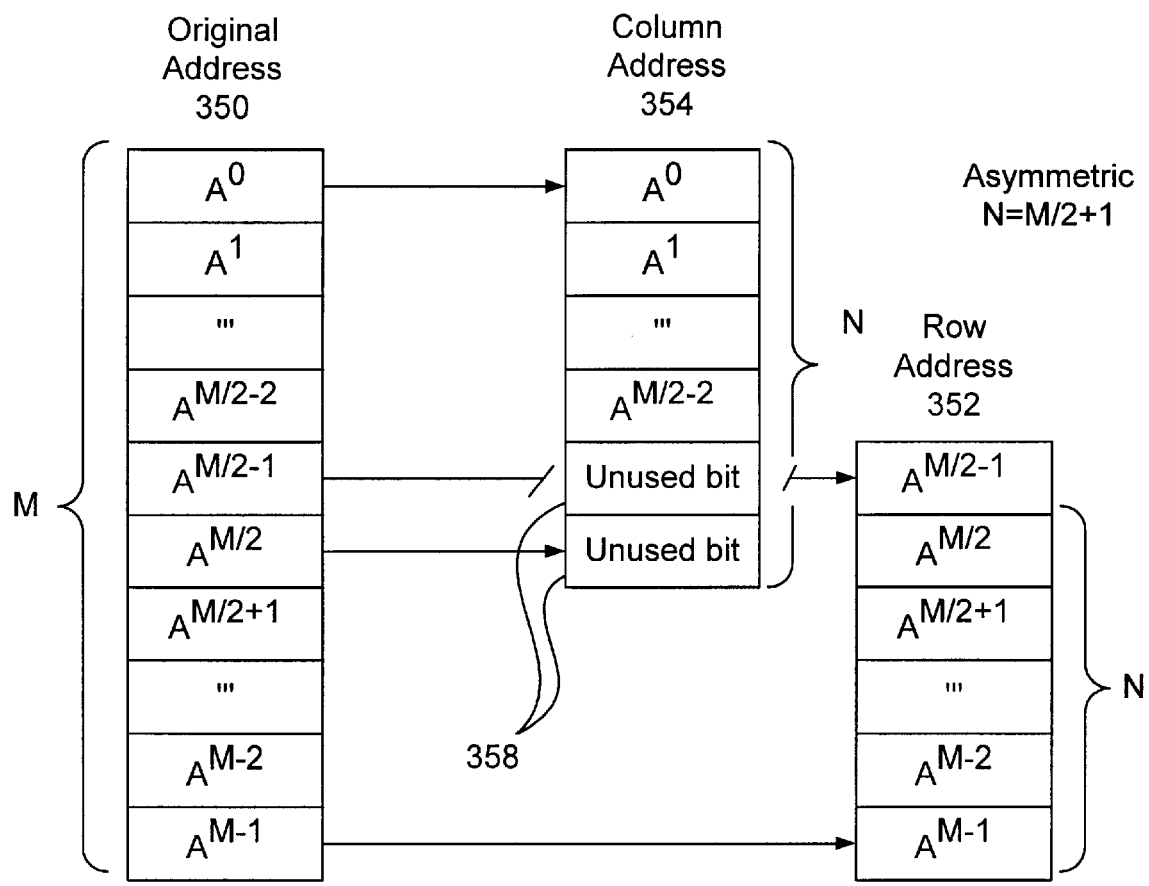

FIG. 3B shows a similar diagram, with M original address bits 350, and N corresponding row address bits 352 and column address bits 354, but refers to the asymmetric DRAM case with four times as many rows as columns, thus N has value M/2+1 and two unused bits 358 are present among the column address bits 354. When a column address is to be generated, the first M/2−1 of M original address bits 350 are mapped, in order, to give the first N−2 column address bits 354. It is not important what value the two unused bits 358 may possess. The row address bits 352 will contain, again in order, the last N (or M/2+1) of M original address bits 350.

Both the symmetric (FIG. 3A) and asymmetric (FIG. 3B) mappings in the prior art manage to access each element in memory by virtue of splitting up the original address bits 300,350 into the appropriate row address bits 302,352 and column address bits 304,354. It is important to note, however, that due to the difference in N, the mappings are offset, thus requiring different wiring when changing from a symmetric DRAM module to an asymmetric one, or vice versa.

Figure 4A:
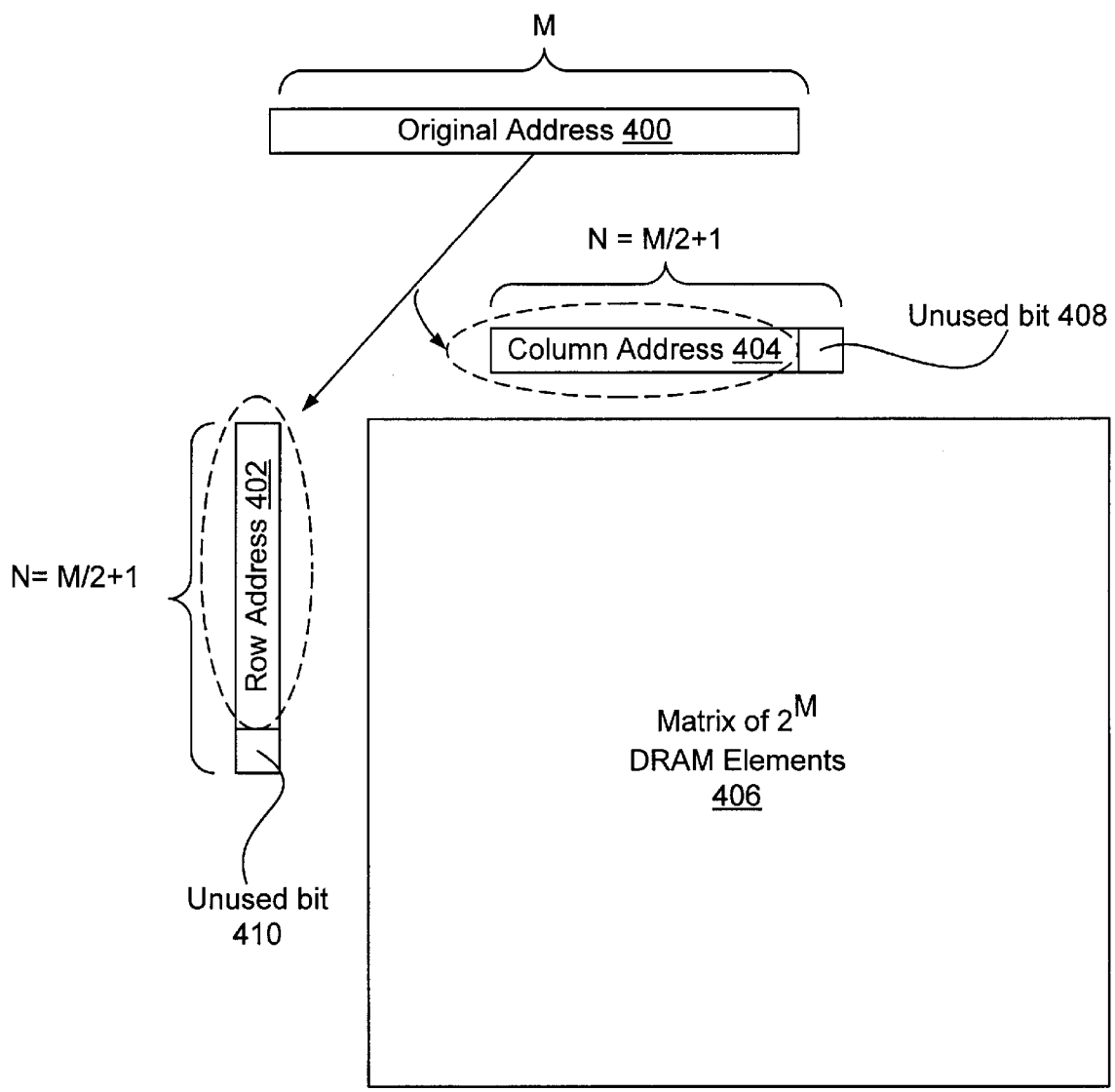
FIGS. 4A and 4B are conceptual illustrations of how, in accordance with the present invention, an original address is mapped into a row address and a column address by the address multiplexer of FIG. 1A.

The present invention will now be described with reference to FIGS. 4A and 4B and FIGS. 5A and 5B. In FIG. 4A, M/2 of N row address bits 402, as well as M/2 of N column address bits 404 stem from M original address bits 400, in accordance with the inventive mapping when applied to a symmetric DRAM module consisting of a matrix of $2^M$ memory elements 406. One unused bit 410 is appended to complete the set of row address bits 402, and an unused bit 408 completes the set of column address bits 404. The number of row address bits 402 (or column address bits 404) equals M/2+1, and is one more than required to access any element of the symmetric DRAM.

Figure 4B:
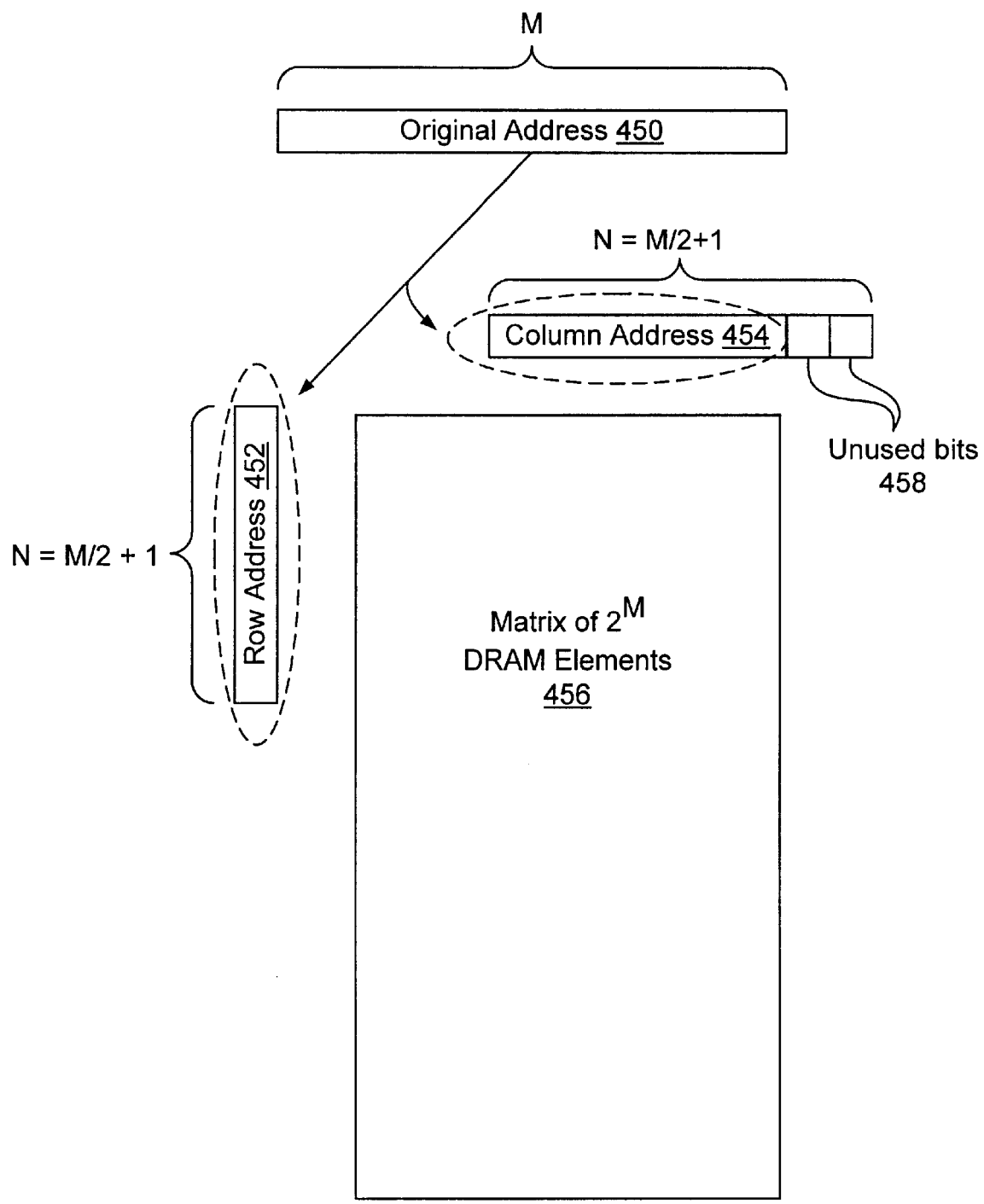

When an asymmetric DRAM module consisting of a matrix of $2^M$ memory elements 456 and a row:column ratio of 4:1 is employed, the inventive mapping generally functions as illustrated in FIG. 4B. A subset of M/2+1 of the M original address bits 450 forms the set of row address bits 452. All M/2−1 remaining bits, along with two unused bits 458, create the set of N M/2+1 column address bits.

It is crucial to observe that N is kept the same, in this case remaining equal to M/2+1, regardless of whether a symmetric or asymmetric DRAM module is used. It is also important to note that although the unused bits 408,410,458 may take on fixed "dummy" values, they can also be made to take on values among the M original address bits 400,450.

Figure 5A:
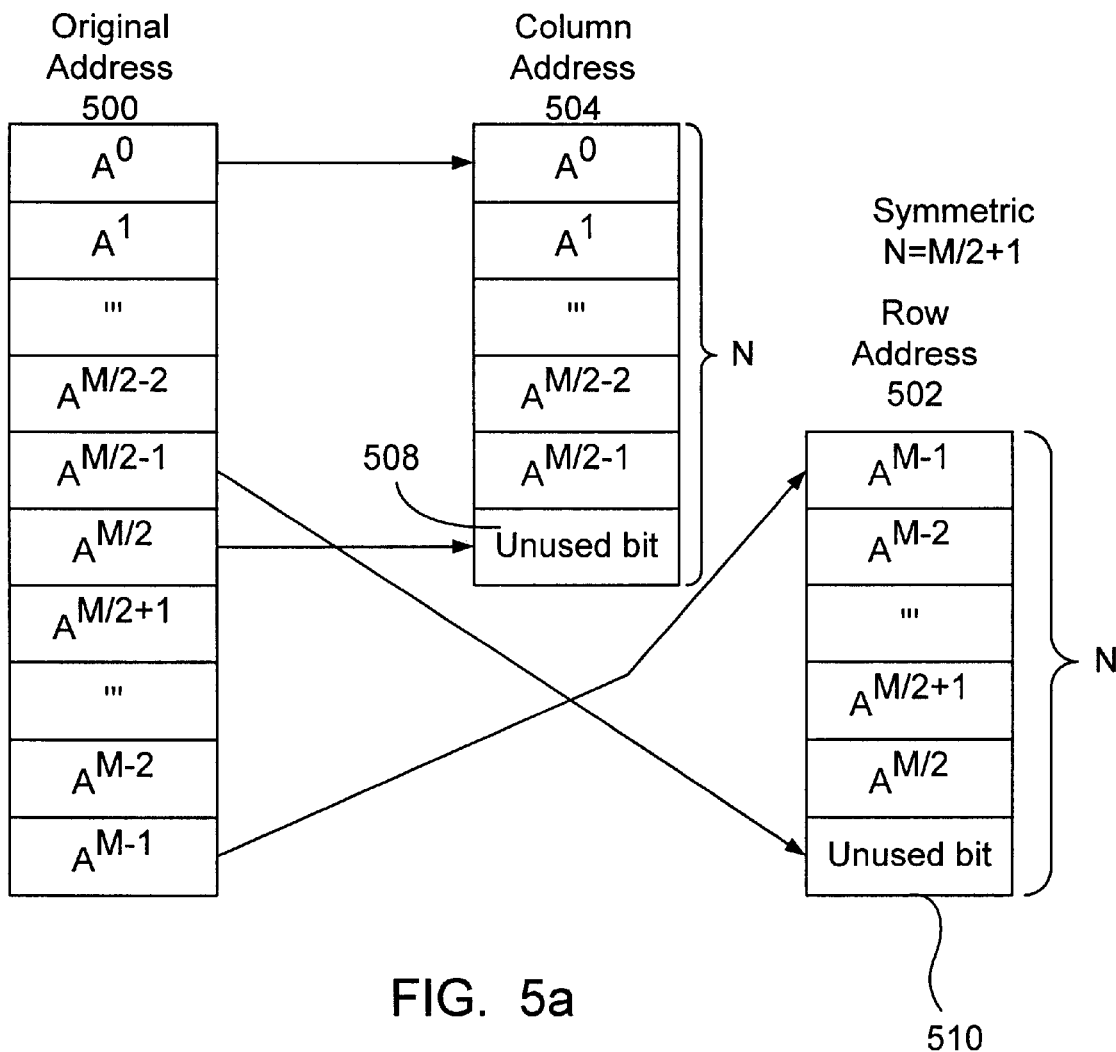
FIGS. 5A and 5B are detailed diagrams illustrating the inventive mappings of FIGS. 4A and 4B, respectively.
Figure 5B:
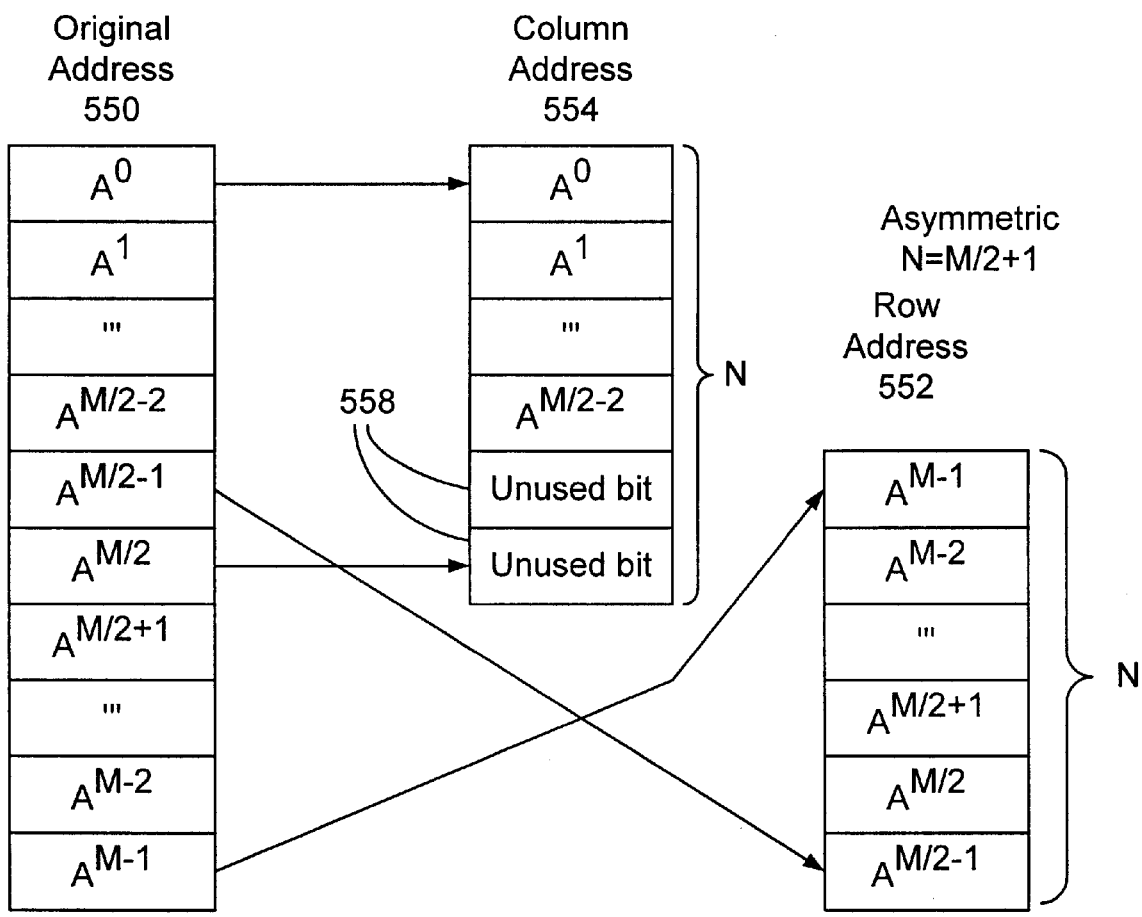

Referring now to FIGS. 5A and 5B, when the strobe signal (22 in FIG. 1) is set such that a column address is to be fed to a symmetric DRAM module, N column address bits 504 are extracted, in order, from the first N of M original address bits 500. It is noted that the last bit among the column address bits 504 will remain unused. If a row address is to be generated then the last N of M original address bits 500 yield, in reverse order, the row address bits 502, i.e. the first bit of the row address is the last bit, $A^{M-1}$, of the original address, and so on. Still referring to the symmetric case the last bit among the row address bits 502 is an unused bit 510.

In FIG. 5B, when an asymmetric DRAM module is employed, exactly the same mapping as in the symmetric case is used to generate N column address bits 554 and N column address bits 552 from M original address bits 550. Two unused bits 558 now appear only among the column address bits 554.

In summary, if the address multiplexer 28 is designed to perform the inventive mapping described herein, then every memory element of a $2^M$-element DRAM module 10 can be accessed, whether the module be symmetric or asymmetric, although in the symmetric case, additional, unused address lines will be present among the N DRAM address lines 12.

An asymmetric DRAM module has heretofore been taken to have a row:column ratio of 4:1. It is within the scope of the present invention, nevertheless, to address (asymmetric) DRAM modules having a different ratio of rows to columns, such as 4:1, 16:1, 64:1 or as a rule R:1, where R is a power of four. In the general case, with M original address bits and a row:column ratio of R:1, the necessary number of bits to represent a row will be $$\frac{M + \log_2 R}{2}$$

and the minimum amount of bits required to represent a column will be $$\frac{M - \log_2 R}{2}$$

Clearly, a symmetric DRAM module always requires M/2 bits to represent either the row or the column.

The key to the applying the inventive mapping in the general case is to keep N, the number of DRAM address lines, identical between symmetric and asymmetric DRAM modules of the same size, i.e., $$N = \frac{M + \log_2 R}{2}.$$

Obviously, a maximum value of R is to be anticipated so that the required number of DRAM address lines can be incorporated into the design of the address multiplexer.

While the preferred embodiment of the invention has been described and illustrated it will be apparent to one skilled in the art that further variations in the design may be made. The scope of the invention, therefore, is only to be limited by the claims appended hereto.

We claim:

1. A method of addressing a DRAM module, either symmetric or asymmetric, having a matrix of $2^M$ memory elements arranged in rows and columns, the method comprising:

receiving an original address comprising a plurality of bits 0 to M−1 identifying a specific memory element; and deriving from the plurality of bits a column address and row address which together identify the specific memory element;

wherein the column address comprises a plurality of bits 0 to N−1 which match in direct order bits 0 to N−1 of the original address and the row address comprises a plurality of bits 0 to N−1 which match in reverse order bits N−2 to M−1 of the original address;

wherein upon addressing an asymmetric DRAM module with R times as many as rows as columns, N equals to (M+log$_2$R)/2.

2. A method of addressing a DRAM module according to claim 1, wherein upon addressing a symmetric DRAM module, at least one bit of the column address is unused and at least one bit of the row address is unused and upon addressing an asymmetric DRAM module, at least two bits of the column address are unused and all bits of the row address are used.

3. A method of reading to and writing from memory elements in a dynamic random access memory (DRAM) module using a microprocessor and a circuit, the memory module having a plurality of memory elements arranged in rows and columns and a plurality of DRAM address lines, the memory elements each possessing a respective address, the circuit having a plurality of input demux address lines 0 to M−1 and a plurality of output demux address lines 0 to N−1 connected to the DRAM address lines of the memory module, the method comprising;

the microprocessor specifying to the circuit the address of a specific memory element on the M input demux address lines of the circuit; and the circuit selectively connecting the input address lines to the output demux address lines in a column mapping or a row mapping, wherein the column mapping associates output demux address lines 0 to N−1 with input demux address lines 0 to N−1 in direct order, and the row mapping associates output demux address lines 0 to N−1 with input demux address lines N−2 to M−1 in reverse order, thereby specifying to the memory module the address of the specific memory element on the N output demux address lines of the circuit.

4. A method of addressing a DRAM module, either symmetric or asymmetric, having a matrix of $2^M$ memory elements arranged in rows and columns, the method comprising:

receiving an original address comprising a plurality of bits 0 to M−1 identifying a specific memory element; and deriving from the plurality of bits a column address and row address which together identify the specific memory element;

wherein the column address comprises a plurality of bits 0 to N−1 which match in direct order bits 0 to N−1 of the original address and the row address comprises a plurality of bits 0 to N−1 which match in reverse order bits M−N to M−1 of the original address;

wherein upon addressing an asymmetric DRAM module with R time as many as rows as columns, N equals to (M+log$_2$R)/2.

5. A method of addressing a DRAM module according to claim 4, wherein upon addressing a symmetric DRAM module, at least one bit of the column address is unused and at least one bit of the row address is unused and upon addressing an asymmetric DRAM module, at least two bits of the column address are unused and all bits of the row address are used.

6. A method of reading to and writing from memory elements in a dynamic random access memory (DRAM) module using a microprocessor and a circuit, the memory module having a plurality of memory elements arranged in rows and columns and a plurality of DRAM address lines, the memory elements each possessing a respective address, the circuit having a plurality of input demux address lines 0 to M−1 and a plurality of output demux address lines 0 to N−1 connected to the DRAM address lines of the memory module, the method comprising;

the microprocessor specifying to the circuit the address of a specific memory element on the M input demux address lines of the circuit; and the circuit selectively connecting the input address lines to the output demux address lines in a column mapping or a row mapping, wherein the column mapping associates output demux address lines 0 to N−1 with input demux address lines 0 to N−1 in direct order, and the row mapping associates output demux address lines 0 to N−1 with input demux address lines M−N to M−1 in reverse order, thereby specifying to the memory module the address of the specific memory element on the N output demux address lines of the circuit.

* * * * *